United States Patent [19]

Algor

[11] Patent Number: 4,873,499
[45] Date of Patent: Oct. 10, 1989

[54] FAST RISE PULSE OSCILLATOR
[75] Inventor: Marshall M. Algor, Conover, N.C.
[73] Assignee: The United States of America as represented by the Secretary of the Army, Washington, D.C.
[21] Appl. No.: 199,824
[22] Filed: May 26, 1988
[51] Int. Cl.[4] .............................................. H03B 5/12
[52] U.S. Cl. .................................. 331/117 R; 331/173
[58] Field of Search ................... 331/117 R, 172, 173, 331/174

[56] References Cited
U.S. PATENT DOCUMENTS
3,849,741 11/1974 Groom, III et al. ................ 331/165
4,683,446 7/1987 McDonald ...................... 331/173 X Primary Examiner—David Mis
Attorney, Agent, or Firm—Guy M. Miller; Saul Elbaum; Muzio B. Roberto

[57] ABSTRACT

A circuit and method of operation thereof for initiating a fast rise pulse oscillator in a projectile fuzing system is less susceptible to external counter measures. The oscillator circuit includes an oscillator transistor which has a step recovery diode connected to the base of the transistor. The step recovery diode is forward biased for storing charge therein and then reverse biased thereby producing an internal transient in a tank circuit, also connected to the base of the transistor, which produces a rapid buildup of oscillations.

9 Claims, 6 Drawing Sheets

FAST RISE PULSE OSCILLATOR

RIGHTS OF THE GOVERNMENT

The invention described herein may be manufactured, used and licensed by or for the United States Government for Governmental purposes without payment to me of any royalty thereon.

BACKGROUND OF THE INVENTION

1. Field of the Invention

This invention relates generally to oscillating systems and more particularly to a method and circuit which produces rapid initiation of the rise time in the output of an oscillator.

2. Description of the Prior Art

Desirable characteristics for an oscillator in a projectile fuzing system are starting the oscillator pulse rapidly so that its initial amplitude is a substantial portion of its final amplitude and having its starting phase controlled by a modulating pulse, so that it is immune from external interfering signals. Advantages of a projectile fuzing system with these characteristics include lessening the effect external counter-measure signals have on the fuze, increasing fuze performance, improving system sensitivity, and range cut off performance.

A prior fast rise time oscillator, described in U.S. Pat. No. 3,849,741, issued to Groom, III et al. on Nov. 19, 1974 uses a transient, generated within the oscillator transistor by stored charge depletion during the modulating pulse, causing rapid oscillation build-up. The oscillator circuit includes a transistor which initially has one of its junctions in a forward biased condition, and which then is caused to operate in a normal transistor mode which reverse-biases the junction to produce an internal transient caused by the quick turn-off time of the junction. However, there are several disadvantages to using this system. While pulse build-up is relatively fast, it still requires several rf cycles (about 400 MHz) and does not exploit the full potential of stored-charge depletion (step-recovery) devices. Additionally, this transient performance is an incidental property of the oscillator transistor, not defined by any recognized specification. Finally, it is not wise to tie together in one device both step-recovery and oscillator performance requirements.

SUMMARY OF THE INVENTION

It is therefore an object of this invention to provide an oscillator in a projectile fuzing system that is less susceptible to external counter measures.

It is a further object of this invention to provide an improved method of starting an oscillator pulse rapidly, so that its initial amplitude is a substantial portion of its final amplitude, by using a step recovery diode.

A still further object of this invention is to provide an oscillator which has its starting phase uniquely controlled by a modulation pulse to the exclusion of external interfering signals.

The above and other objects, features, and advantages of the present invention will be better understood from the following detailed description taken in conjunction with the accompanying drawings.

DESCRIPTION OF THE PREFERRED EMBODIMENTS

Figure 1:
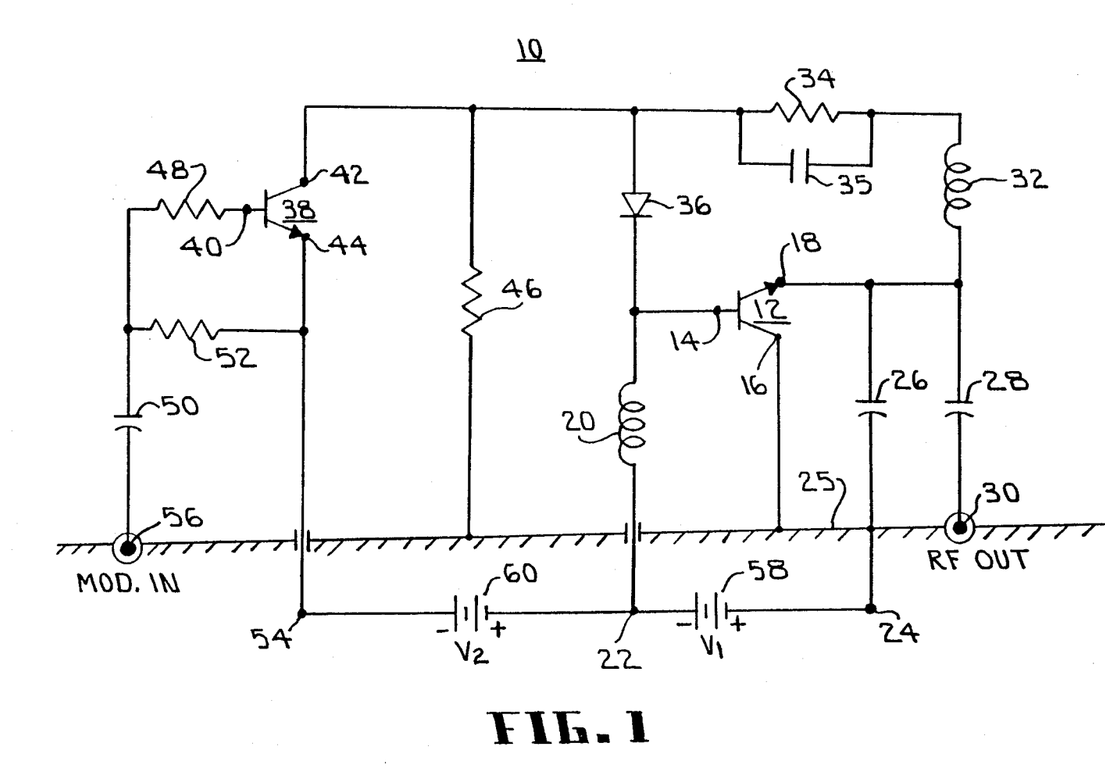
FIG. 1 shows a fast rise pulse oscillator according to a first embodiment of the present invention.

Referring now to FIG. 1, an oscillator 10 is illustrated according to the present invention. A transistor 12 has a base 14, collector 16 and emitter 18. One side of inductor 20 is connected to base 14 while the other side is connected to power supply terminal 22. Collector 16 is connected to power supply terminal 24 and ground plane 25. Capacitor 26 has one side connected to emitter 18 while the other side is connected to power supply terminal 24. Capacitor 28 has one side connected to emitter 18 while the other side is connected to output terminal 30. Inductor 32 has a first side electrically connected to emitter 18 and a second side electrically connected to resistor 34. The other side of resistor 34 is connected to a first side of diode 36 which has its second side connected to base 14. Capacitor 35 is connected in parallel with resistor 34. A transistor 38 has a base 40, collector 42 and emitter 44. Resistor 46 has one side connected to collector 42 and the first side of diode 36 while the other side of resistor 46 is connected to power supply terminal 24. Resistor 48 has one side connected to base 40 while the other side is connected to capacitor 50 and resistor 52. The other side of resistor 52 and emitter 44 are each connected to power supply terminal 54. Capacitor 50 is connected to drive terminal 56.

The oscillator of FIG. 1 shows an embodiment according to the present invention that operates off a dual supply. The oscillator circuit is pulsed at a drive input 56. Between pulses, a forward current flows through resistor 46, step recovery diode (SRD) 36, and inductor 20. The oscillator 10 has a transistor 12 with a collector 16 connected to supply terminal 24 or supply 58, setting up a fixed collector bias of $V_1$. When a drive pulse is introduced at the drive input 56, turning on transistor 38, the emitter 18 of transistor 12 is pulsed negatively by the modulator transistor 38. This negative pulse also supplies a reverse polarity pulse to the SRD 36. Charge previously stored in the SRD 36, by the forward current though it via resistor 46, is removed from its junction region at a high rate through the series combination of inductor 20, SRD 36, transistor 38 and supply 60. When the charge is depleted, the SRD 36 impedance suddenly increases to the limiting value of its reverse capacitance at a rate sufficient for the current step to shock excite inductor 20. Oscillator build-up now takes over to continue the rf pulse which is outputted at terminal 30. Pulse decay occurs by load damping as transistor 38 turns off, aided by a resumption of forward current in the SRD 36, which now provides a reverse base-emitter bias for transistor 12. Power is extracted from the emitter 18 of transistor 12, and is matched to a 50 ohm load by capacitor 28.

Figure 2:
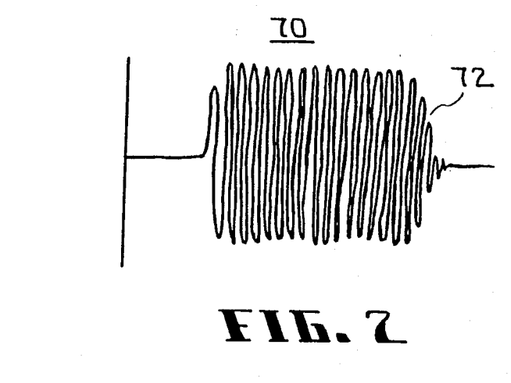
FIG. 2 shows a typical rf pulse generated by the circuit of FIG. 1.

A typical 100 ns rf pulse obtainable with this circuit is shown in FIG. 2. The rf pulse 70, has a build-up that is considerably faster than that attained in prior art circuits. However, minority carrier storage in transistor 38 under these saturated conditions prevents transistor 38 from opening promptly at the end of the drive pulse, and explains the rather "long" tail 72, which is also present in the prior art circuits.

A second embodiment of the present invention has two important distinctions from the circuit shown in FIG. 1. The first modification concerns the use of a pulsed voltage doubler, which allows a single dc supply to serve the purpose of the dual supply arrangement. The second modification concerns the substitution of a field effect transistor of VMOS structure for the bipolar transistor 38 in FIG. 1, thus eliminating problems of minority carrier storage.

Figure 3:
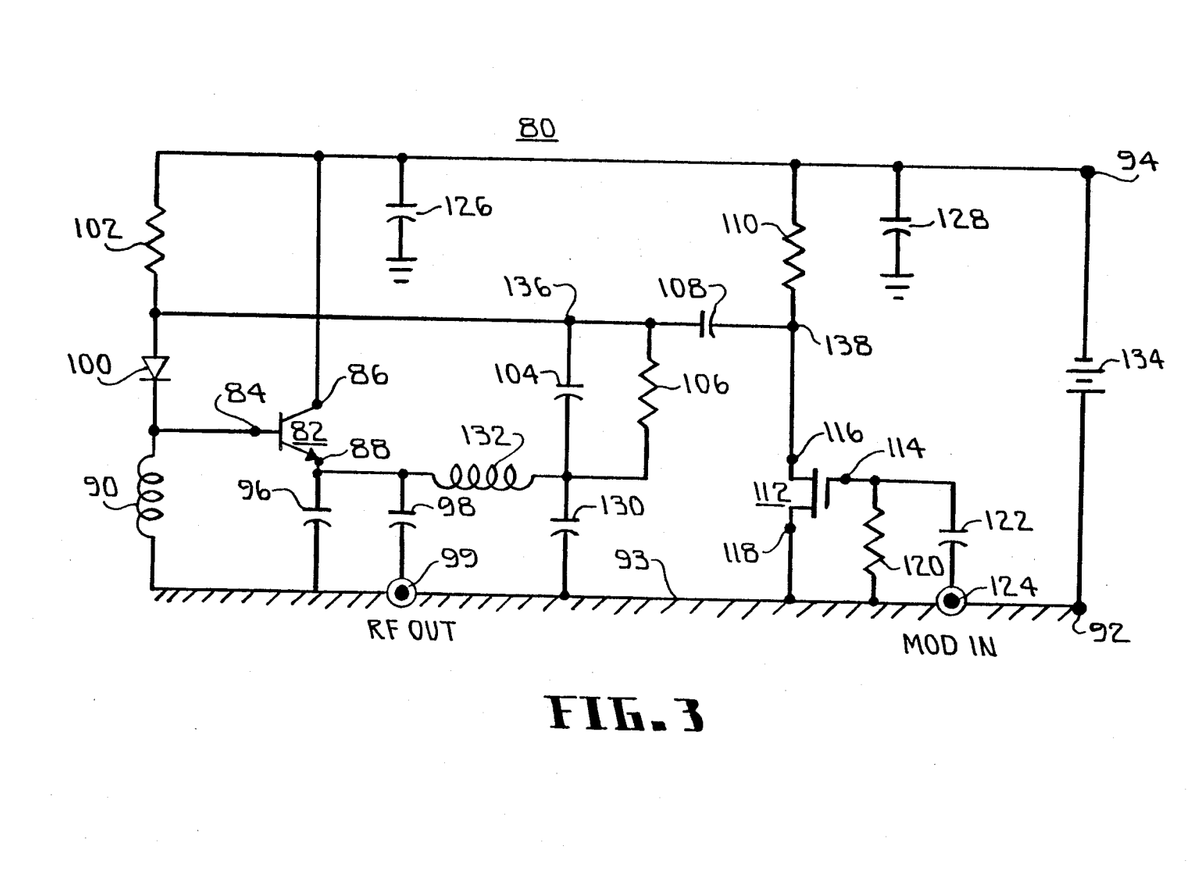
FIG. 3 shows a fast rise pulse oscillator according to a second embodiment of the present invention.

Referring now to FIG. 3, an oscillator 80 is illustrated according to another embodiment of the present invention. A transistor 82 has a base 84, collector 86 and emitter 88. One side of inductor 90 is connected to base 84 while the other side is connected to power supply terminal 92 and ground plane 93. Collector 86 is connected to power supply terminal 94. Capacitor 96 has one side connected to emitter 88 while the other side is connected to terminal 92. Capacitor 98 has one side connected to emitter 88 while the other side is connected to output terminal 99. Step recovery diode 100 has a first side connected to base 84 while a second side is connected to a resistor 102, a parallel combination of capacitor 104 and resistor 106, and a first side of capacitor 108. The other side of resistor 102 is connected to terminal 94 while the second side of capacitor 108 is connected to resistor 110 which is then connected to terminal 94. A transistor 112 has a gate 114, a source/drain 116 and a drain/source 118. Source/drain 116 is connected to the second side of capacitor 108, drain/source 118 is connected to terminal 92, while gate 114 is connected to resistor 120 which is then connected to terminal 92. Capacitor 122 has one side connected to gate 114 while the other side is connected to drive terminal 124. Capacitors 126 and 128 are each connected to terminal 94 on one side and the ground plane 93 on their other side. Capacitor 130 is connected on one side to the parallel combination of capacitor 104 and resistor 106 while the other side is connected to terminal 92. Inductor 132 is connected between capacitor 130 and emitter 88. Pulse oscillator circuit 80 shows power supply terminal 94 connected to a power supply 134. The oscillator will produce a well shaped rf pulse with its dc supply reduced to only 2 volts. However for illustration purposes 15 volts will be used as the supply voltage $V_1$. The oscillator transistor 82 has a collector 86 with a fixed collector-base bias of ·15 volts. The circuit is pulsed at the drive input 124. Between pulses, a forward current flows though resistor 102, SRD 100, and inductor 90. A 0.7 volt voltage drop provides reverse bias to the emitter-base junction of transistor 82. Point 136 and the emitter 88 are therefore at about 0.7 volts from ground while point 138 is at the supply voltage of 15 volts. When a pulse (eg. 10 volts) is introduced at the drive input 124 transistor 112 turns on. This results in point 138 dropping rapidly to within a couple of volts of ground, causing point 136 to follow by a like amount. This change causes the charge previously stored in the SRD 100 by forward current through resistor 102 to be removed at a high rate through the series combination of inductor 90, SRD 100, capacitor 108, transistor 112 and ground 93. When the charge is depleted, the SRD 100 impedance suddenly increases to the limiting value of its reverse capacitance, at a rate sufficient for the current step to shock-excite inductor 90. The current step produces a positive going transient at the base 84 of transistor 82, which supplements the negative going pulse at the emitter 88 to force the oscillator on with an initial cycle of nearly full amplitude. Oscillator build-up then takes over to continue the rf pulse, which is extracted at terminal 99.

The emitter resistor 106 provides steady state limiting, while capacitor 104 and capacitor 130 improve leading edge squareness by exerting some effect on parasitic circuit ringing. An emitter isolation choke (inductor 132) is not critical but does influence ringing somewhat.

Figure 4:
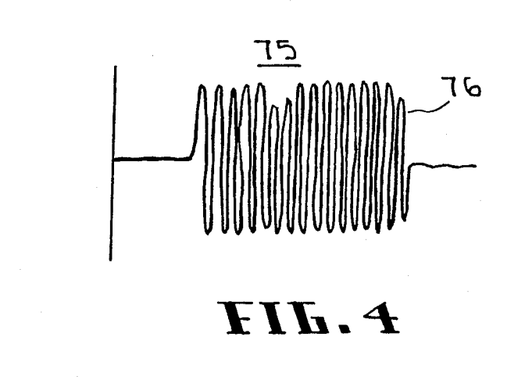
FIG. 4 shows a typical rf pulse generated by the circuit of FIG. 3.

When the modulating pulse turns off, transistor 112 opens quickly. A field effect transistor (FET) is used instead of a bipolar transistor because the FET uses only majority carriers. As mentioned before, minority carrier storage associated with bipolar transistors under saturated switching conditions prevents the transistor from opening promptly at the end of the drive pulse, resulting in a rf pulse with a long decay. FIG. 4 shows a typical 100ns rf pulse 75 obtainable using a FET instead of a bipolar transistor. Note the sharp cut-off 76.

After transistor 112 turns off, point 138 rises again towards the supply voltage $V_1$, and capacitor 108 recharges through resistor 110, SRD 100 and inductor 90. The SRD 100 is thus driven into forward conduction faster than it would by means of resistor 102 alone; while the rf pulse at output terminal 99 is terminated more rapidly than by simple load damping.

The SRD 100 is thus serving four functions. It is used as a source of reverse bias for the oscillator between drive pulses, as a charging diode for the voltage doubling function, as a current-step generating device and as a switched rf loading element. During the pulse, the reverse biased capacitance of the SRD 100 also influences oscillator frequency and feedback.

The power to supply the oscillator emitter/base pulse comes solely from part of the energy stored in capacitor 108, with a sufficient excess being available to minimize pulse droop. A value of 0.01 micro farads has been found adequate for 50 nanosecond pulse widths. It is important for capacitor 108 to be almost fully recharged during the pulse off time, or the magnitude of the negative pulse available at point 136 will be reduced. Thus, the maximum value of resistor 110 is determined such that the product of resistor 110 and capacitor 108 is about one pulse period. Too low a value, however, increases power supply average current and ripple voltage needlessly. The peak current which flows through resistor 110 is small compared with the total pulse current which returns to ground through transistor 112 due to the discharge of capacitor 108.

The rate of rise of pulse current in the series comprising inductor 90, SRD 100, capacitor 108, and transistor 112 is determined by total path inductance and by the shape of the drive pulse which turns on transistor 112. A slow turn on causes energy stored in capacitor 108 to be dissipated within transistor 112, instead of being transferred to a magnetic flux in inductor 90 and other stray inductance in the discharge path. This magnetic flux provides the voltage transient when the series current is interrupted by the SRD step. The flux is maximized if the peak current approaches the steady state value determined by the voltage remaining across capacitor 108 and the total series resistance. This could be on the order of one to several amperes. Obviously, the charge originally stored in the SRD 100 (not to be confused with the energy stored in capacitor 108) must be sufficient so that the SRD 100 will not open much before this maximum current is reached. The amount of stored charge should not, however, be in excess of this value, or power supply current will be wasted, and the delay between the drive pulse and rf output will become excessive.

The oscillator tank circuit may be considered to comprise inductor 90, together with stray parasitic reactive elements internal and external to transistor 82. Also shunting inductor 90 is the reverse-biased capacitance of the SRD 100. Feedback is accomplished by internal coupling to the emitter 88, aided by capacitor 96. Capacitor 126 being in series with the collector 86 return to ground must have a very small capacitance or inductive reactance at the rf frequency. It is preferably of simple parallel plate geometry, on one side of which transistor 82 is mounted.

Power is extracted from the emitter 88 of transistor 82 and is matched to a 50 ohm load by capacitor 98. This unconventional output point results in a less complex circuit, fewer parasitic ringing problems, and greater output than other methods tried.

Figure 5:
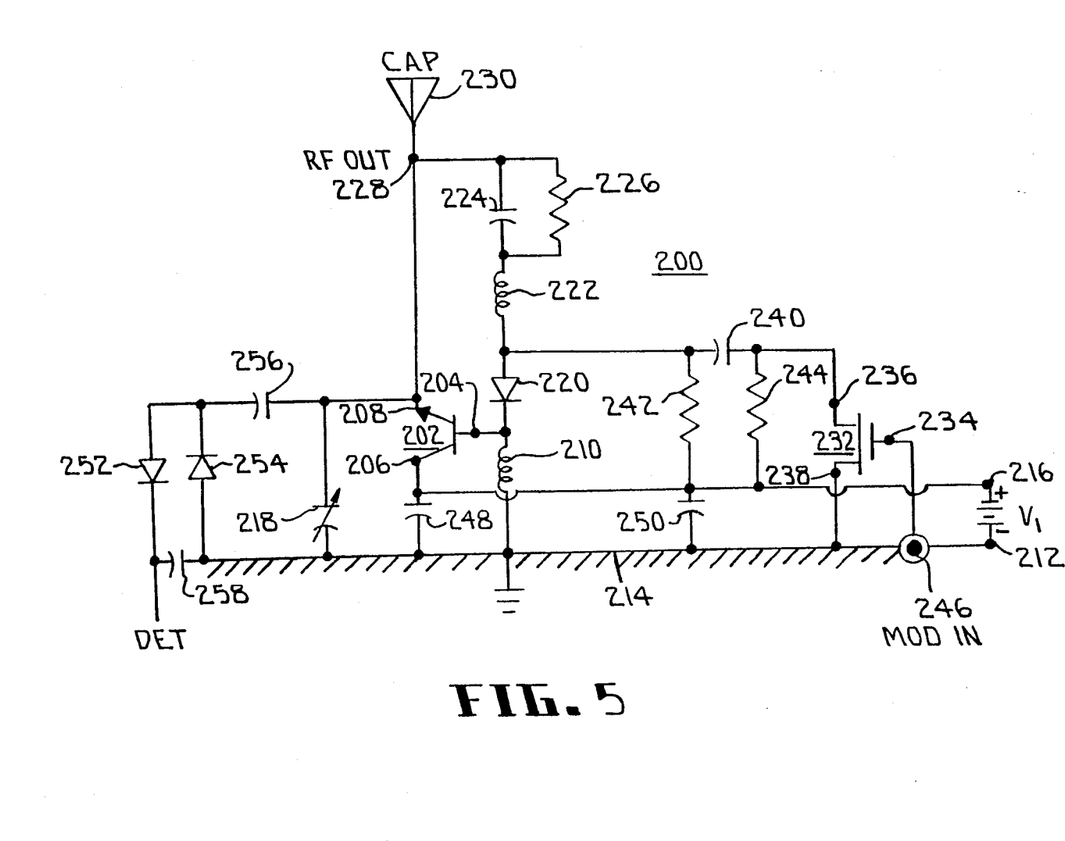
FIG. 5 shows a fast rise pulse oscillator according to a another embodiment of the present invention.

A typical set of values for the components of the circuit of FIG. 3 is as follows:

Another embodiment of the present invention was made in minature form on a substrate. Referring to FIG. 5 an oscillator 200 is illustrated according to another embodiment of the present invention. A transistor 202 has a base 204, collector 206 and emitter 208. One side of inductor 210 is connected to base 204 while the other side is connected to power supply terminal 212 and ground plane 214. Collector 206 is connected to power supply terminal 216. Capacitor 218 has one side connected to emitter 208 while the other side is connected to terminal 212. Step recovery diode 220 has a first side connected to base 204 while a second side is connected to an inductor 222, a first side of capacitor 240, and first side of resistor 242, which has a second side connected to terminal 216. Inductor 222 has its other side connected to a parallel combination of capacitor 224 and resistor 226 which is then connected to emitter 208. The emitter 208 is also connected to an rf output terminal 228 which terminates with a Cap 230. A transistor 232, has a gate 234, a source/drain 236 and a drain/source 238. Source/drain 236 is connected to the second side of capacitor 240 and a first side of resistor 244 which has a second side connected to terminal 216. Drain/source 238 is connected to terminal 212 while gate 234 is connected to modulation terminal 246. Capacitors 248 and 250 are each connected to terminal 216 on their one side and ground plane 214 on their other side. An addition to this circuit not present in the other two embodiments is the detector network comprising diodes 252 and 254 connected to emitter 208 through capacitor 256 and capacitor 258. Deleted are the capacitor and resistor biasing components for transistor 232 as this function is performed in another part of the fuzing system.

Figure 6:
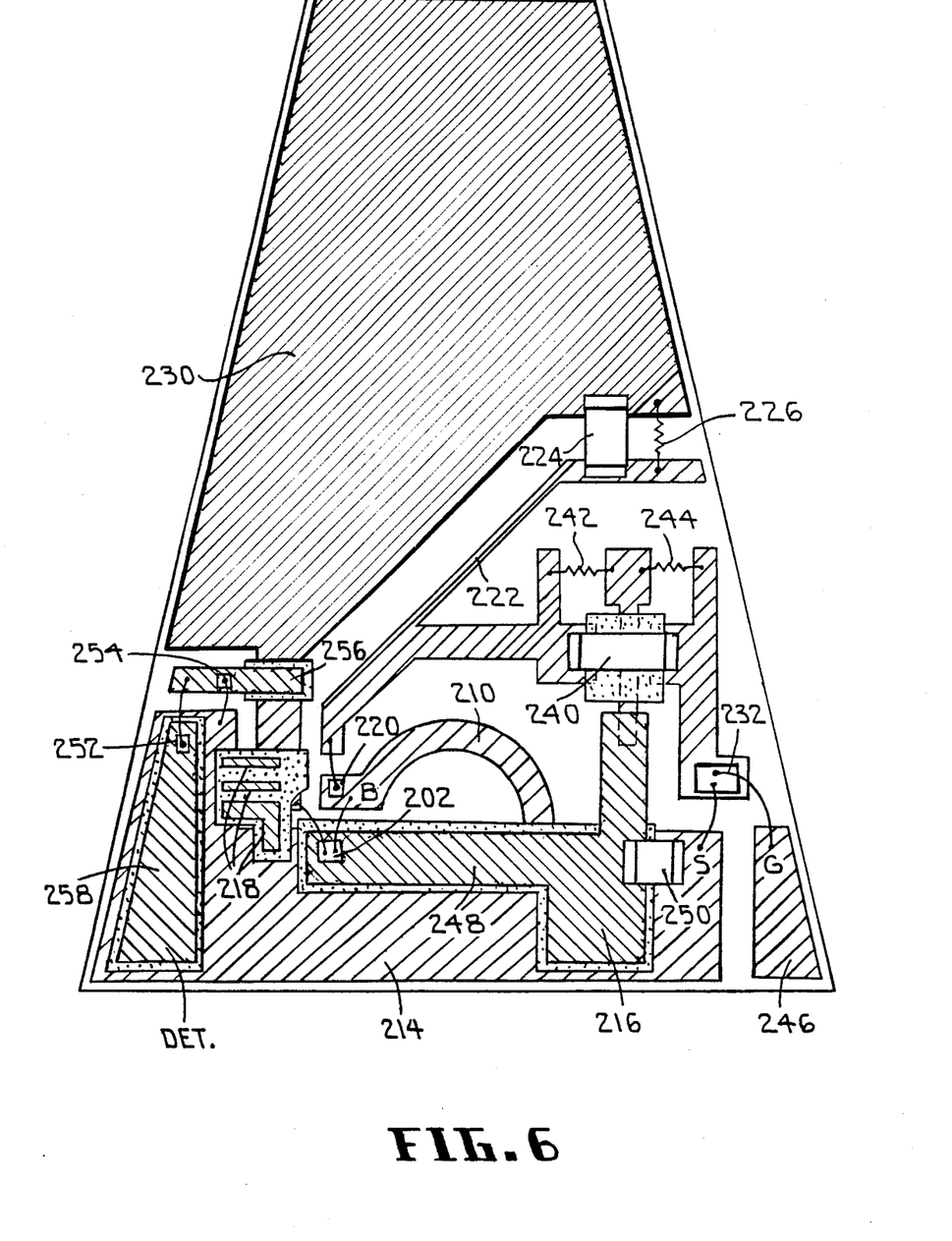
FIG. 6 shows a hybrid layout of the circuit of FIG. 5 on a substrate according to the embodiment in FIG. 5.

The layout on a substrate suitable for use in a fuzing device is shown in FIG. 6, where like reference numerals represent identical or corresponding parts as referenced in FIG. 5. The substrate, which may be ceramic, has a first metalization layer represented by hatch lines, a second dielectric semiconductor layer represented by dots and a third metalization layer represented by cross-hatch lines. The first metalization layer is used for circuit layout and for forming inductors 210 and 222. The three layers combined form capacitors 258, 256, 248, and 218. Rough adjustments affecting frequency, as well as oscillator feedback, can be made with capacitor 218 which is a composite of several small capacitor segments that can be combined or erased as desired. All other capacitors, 224, 240 and 250 are discrete chip devices.

The large "cap" area is intended for direct radiation when properly mounted on a projectile, or to couple capacitively to an extension structure.

While the oscillator of FIG. 5 oscillated well with peak powers comparable to the earlier circuits at a similar frequency, making the circuit smaller and neater as in FIG. 6 resulted in greatly reducing the fast turn on feature compared with previous larger embodiments. It was deduced that parasitic lead inductance in the modulator layout of previous circuits had played a greater part than had previously been realized in storing magnetic flux just prior to SRD cut-off. An examination of the circuit layout of FIG. 3, for example, showed that compared with the oscillator inductor 90, the inductance in the remaining SRD discharge path through capacitor 108 and transistor 112 back to ground 93 was much greater. The equivalent inductance in the circuit layout in FIG. 6 is much less. With the total inductance thus reduced, the SRD stored charge is dissipated before the modulator transistor 232 fully turns on; and there is no snap.

Figure 7:
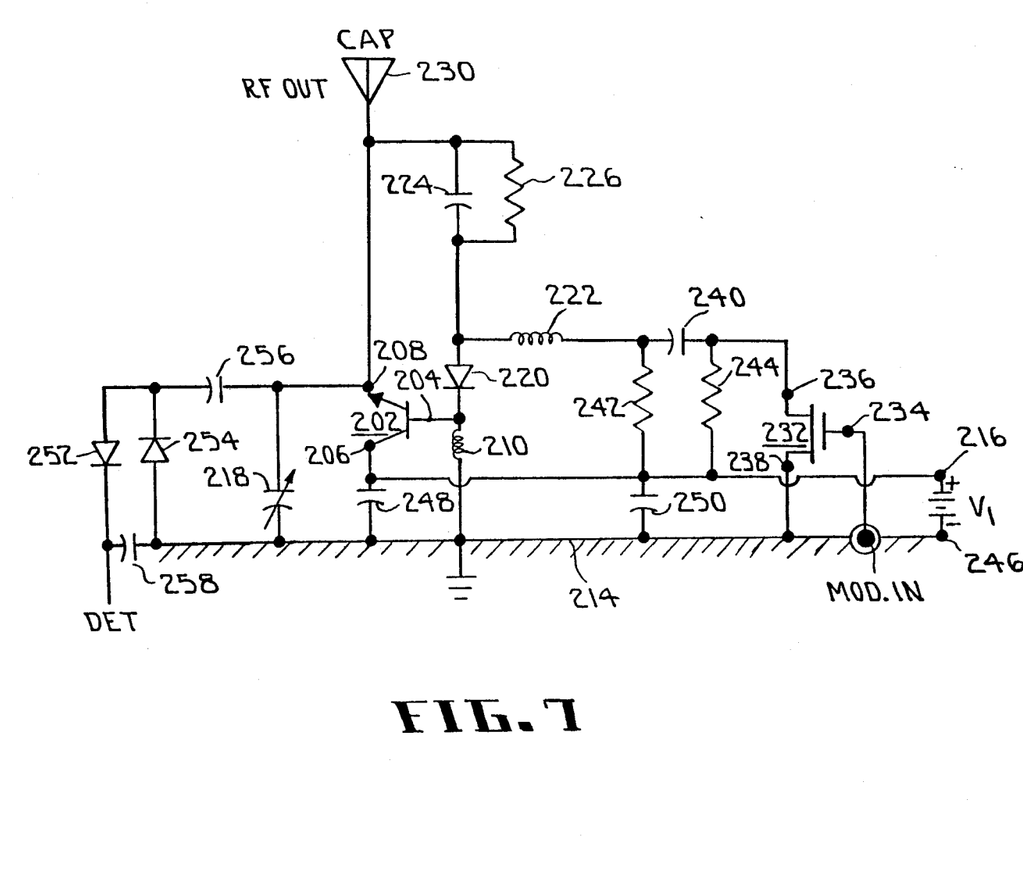
FIG. 7 shows a fast rise pulse oscillator according to still another embodiment of the present invention.

Correction requires one or more of the following: (1) a much faster rise modulator pulse; (2) increased charge storage in the SRD, or; (3) increased inductance in the discharge path. The third method is the most practical. Modifying the circuit of FIG. 5, by increasing the inductance in the discharge path, results in the preferred circuit embodiment of FIG. 7. The circuits are identical except for the location of inductor 222. In its new location, inductor 222 still provides rf isolation between the emitter 208 of transistor 202 and the modulator transistor 232. However, it no longer impedes the build-up of emitter current caused by the voltage step across the SRD. This full voltage step is available directly between base 204 and emitter 208 of the oscillator transistor 202. In addition, a greater total magnetic flux can be produced prior to SRD cut-off, and the need for a third discrete inductor is eliminated.

Those skilled in the art will appreciate that many variations of the above described embodiment of the invention may be made without departing from the spirit and scope of the invention.

What is claimed is:

1. An oscillator for producing an output having fast rise time oscillations comprising:
    an output terminal;
    a first power supply terminal;
    a second power supply terminal;
    an oscillator transistor having a collector connected to said first power supply terminal, an emitter connected to said output terminal, and a base;
    a step recovery diode connected to the base of said oscillator transistor;
    a tank circuit connected between said second power supply terminal and the base of said oscillator transistor;
    first network biasing means connected to said first power supply terminal for effectuating a forward bias current through said step recovery diode;

second network biasing means connected to said step recovery diode for reverse biasing said step recovery diode to produce a momentary reverse current that causes an internal transient in said tank circuit immediately prior to initiation of oscillations.

2. An oscillator according to claim 1 wherein said first network biasing means comprises:
first resistive means.

3. An oscillator according to claim 2 wherein said second network biasing means comprises;
second resistive means connected to said first supply voltage terminal;
switch means connected in series between said second resistive means and said second supply terminal; and
capacitive means connected between said step recovery diode and said second resistive means.

4. An oscillator according to claim 3 wherein said switch means comprises:
a field effect transistor.

5. An oscillator according to claim 1 further comprising:
capactive means connected between an emitter of said oscillator transistor and said second supply terminal.

6. An oscillator according to claim 1 wherein said step recovery diode has a cathode connected to the base of said oscillator transistor and an anode connected to said first and second network biasing means.

7. An oscillator according to claim 2 wherein said reverse biasing means comprises:
a third supply voltage terminal; and
switch means connected between said step recovery diode and said third supply voltage terminal.

8. An oscillator according to claim 7 wherein said switch means comprises a bipolar transistor.

9. A method of rapidly initiating oscillations in an oscillator, including a transistor having a base, with a step recovery diode having its anode electrically connected to the base of said transistor and a tank circuit electrically connected to the base of said transistor which comprises the steps of:
forward biasing said step recovery diode to store charge therein; and
reverse biasing said step recovery diode thereby producing an internal transient in said tank circuit which produces a rapid buildup of oscillations in said oscillator.

* * * * *